US008116162B1

(12) United States Patent
Wennekamp et al.

(10) Patent No.: US 8,116,162 B1
(45) Date of Patent: Feb. 14, 2012

(54) DYNAMIC SIGNAL CALIBRATION FOR A HIGH SPEED MEMORY CONTROLLER

(75) Inventors: Wayne E. Wennekamp, Rio Rancho, NM (US); Schuyler E. Shimanek, Albuquerque, NM (US); Mikhail A. Wolf, Albuquerque, NM (US); Adam Elkins, Rio Rancho, NM (US)

(73) Assignee: Xilinx, Inc., San Jose, CA (US)

( * ) Notice: Subject to any disclaimer, the term of this patent is extended or adjusted under 35 U.S.C. 154(b) by 216 days.

(21) Appl. No.: 12/693,397

(22) Filed: Jan. 25, 2010

Related U.S. Application Data

(60) Provisional application No. 61/148,926, filed on Jan. 31, 2009, provisional application No. 61/148,927, filed on Jan. 31, 2009.

(51) Int. Cl.
*G11C 7/00* (2006.01)
(52) U.S. Cl. ........................ 365/222; 365/194
(58) Field of Classification Search .................. 365/222, 365/194
See application file for complete search history.

(56) References Cited

U.S. PATENT DOCUMENTS 6,154,409 A * 11/2000 Huang et al. ................. 365/222
7,038,967 B2 * 5/2006 Uchikoba et al. ............. 365/222

OTHER PUBLICATIONS

U.S. Appl. No. 12/689,558, filed Jan. 19, 2010, Shimanek et al., Xilinx, Inc., 2100 Logic Drive, San Jose, CA.
U.S. Appl. No. 12/689,585, filed Jan. 19, 2010, Shimanek, et al., Xilinx, Inc., 2100 Logic Drive, San Jose, CA.
U.S. Appl. No. 12/689,604, filed Jan. 19, 2010, Flateau, Jr., et al., Xilinx, Inc., 2100 Logic Drive, San Jose, CA.
U.S. Appl. No. 12/694,615, filed Jan. 27, 2010, Shimanek, et al., Xilinx, Inc., 2100 Logic Drive, San Jose, CA.
U.S. Appl. No. 12/694,665, filed Jan. 27, 2010, Wennekamp, et al., Xilinx, Inc., 2100 Logic Drive, San Jose, CA.
U.S. Appl. No. 12/694,973, filed Jan. 27, 2010, Shimanek, et al., Xilinx, Inc., 2100 Logic Drive, San Jose, CA.
U.S. Appl. No. 12/689,636, filed Jan. 19, 2010, Wennekamp, et al., Xilinx, Inc., 2100 Logic Drive, San Jose, CA.
U.S. Appl. No. 12/692,771, filed Jan. 25, 2010, Flateau, Jr., et al., Xilinx, Inc., 2100 Logic Drive, San Jose, CA.
U.S. Appl. No. 12/696,672, filed Jan. 29, 2010, Shimanek, et al., Xilinx, Inc., 2100 Logic Drive, San Jose, CA.
U.S. Appl. No. 12/690,856, filed Jan. 20, 2010, Elkins, et al., Xilinx, Inc., 2100 Logic Drive, San Jose, CA.
U.S. Appl. No. 12/695,341, filed Jan. 28, 2010, Strader, et al., Xilinx, Inc., 2100 Logic Drive, San Jose, CA.
U.S. Appl. No. 12/695,099, filed Jan. 27, 2010, Shimanek, et al., Xilinx, Inc., 2100 Logic Drive, San Jose, CA.
U.S. Appl. No. 12/694,656, filed Jan. 27, 2010, Elkins, et al., Xilinx, Inc., 2100 Logic Drive, San Jose, CA.

* cited by examiner

*Primary Examiner* — Son Dinh
(74) *Attorney, Agent, or Firm* — Kevin T. Cuenot

(57) ABSTRACT

Within an integrated circuit comprising a memory controller, a method can include, responsive to determining that the memory controller is performing a refresh operation, calculating a new tap setting according to a new maximum value and an old tap setting of the delay circuit. The new maximum value specifies a number of taps of the delay circuit that approximates a predetermined time span. The method can include dynamically adjusting a delay applied to a signal by a delay circuit according to the new tap setting. The delay circuit generates a delayed signal that is provided to the memory controller.

20 Claims, 2 Drawing Sheets

DYNAMIC SIGNAL CALIBRATION FOR A HIGH SPEED MEMORY CONTROLLER

CROSS-REFERENCE TO RELATED APPLICATIONS

This application claims benefit of U.S. Provisional Patent Application having the Application No. 61/148,926 filed on Jan. 31, 2009 and entitled "Apparatus and Method for a Memory Controller"; and also U.S. Provisional Patent Application having the Application No. 61/148,927 filed on Jan. 31, 2009 and entitled "Architecture for Advanced Integrated Circuit Providing Good Performance and Low Cost." Both of these provisional patent applications are incorporated herein by reference in their entirety.

FIELD OF THE INVENTION

One or more embodiments disclosed within this specification relate to integrated circuit devices (ICs). More particularly, one or more embodiments relate to calibrating signals for use with a memory controller within an IC.

BACKGROUND

A memory controller is a type of circuit that manages the flow of data going into and coming out from a memory device. The memory controller generates the signals necessary to write data to the memory device and to read data from the memory device. In the case of a dynamic random access memory (DRAM), for example, the memory controller is configured to generate signals for storing data within the DRAM, reading data from the DRAM, and refreshing the DRAM as governed by the relevant controlling specification.

In the case of a Double Data Rate (DDR) Synchronous DRAM (SDRAM), data is transferred between the memory controller and the DDR SDRAM on both the rising edge and the falling edge of the clock signal. A memory controller configured to operate with a DDR SDRAM is configured to generate the signals necessary for storing data within the DDR SDRAM, reading data from the DDR SDRAM, and refreshing the DDR SDRAM, to achieve effectively twice the data throughput of a single data rate memory device/memory controller configuration at the same clock rate.

In order for a memory controller to operate reliably, the clock signal used by the memory controller must be properly aligned with the data signals flowing between the memory controller and the memory device to ensure that data is not lost. Typically, signals are aligned through a calibration process that is performed at startup of the IC within which the memory controller is disposed. As the IC continues to operate, however, variations in voltage and temperature can cause the clock signal provided to the memory controller to drift or become misaligned with respect to the data signals exchanged between the memory controller and the memory device. This drift in alignment between clock signal and data signals increases the likelihood of data loss.

Some systems attempt to re-calibrate the clock and data signals to avoid misalignment. Generally, re-calibration is achieved by first stopping operation of the memory controller, performing the calibration process anew, and then restarting operation of the memory controller. Such techniques are undesirable since interrupting operation of the memory controller slows operation of the larger system within which the memory controller is disposed. Further, re-calibration can be a time consuming process when considered in light of the speed at which the memory device/and memory controller configuration can operate.

SUMMARY

One or more embodiments disclosed within this specification relate to integrated circuit devices (ICs) and, more particularly, to calibrating signals for use with a memory controller within an IC. One embodiment of the present invention can include a method implemented within an IC comprising a memory controller. The method can include, responsive to determining that the memory controller is performing a refresh operation, calculating a new tap setting according to a new maximum value and an old tap setting specifying a delay applied to a signal by a delay circuit. The new maximum value can specify a number of taps of the delay circuit that approximates a predetermined time span. The method also can include dynamically adjusting the delay applied to the signal by the delay circuit according to the new tap setting. The delay circuit can generate a delayed signal that is provided to the memory controller.

Another embodiment of the present invention can include a system disposed within an IC. The system can include a delay circuit configured to apply a delay to a signal generating a delayed signal provided to a memory controller and a measurement circuit configured to calculate a new maximum value specifying a number of taps of the delay circuit that approximates a predetermined time span. The system can include a calibration controller coupled to the delay circuit and the measurement circuit. The calibration controller can be configured to calculate a new tap setting for the delay circuit according to the new maximum value and an old tap setting of the delay circuit responsive to determining that a memory controller is performing a refresh operation. The calibration controller can dynamically adjust the delay applied to the signal by the delay circuit according to the new tap setting.

Another embodiment of the present invention can include a calibration controller disposed within an IC. The calibration controller can include first circuitry configured to calculate a new tap setting for a delay circuit according to a new maximum value and an old tap setting of the delay circuit responsive to determining that a memory controller is performing a refresh operation. The new maximum value can specify a number of taps of the delay circuit that approximates a predetermined time span. The calibration controller further can include second circuitry coupled to the first circuitry. The second circuitry can be configured to dynamically adjust the delay applied to the signal according to the new tap setting by outputting the new tap setting to the delay circuit. The first and second circuitry can be operational to calculate the new tap setting and adjust the delay prior to completion of the refresh operation.

DETAILED DESCRIPTION OF THE DRAWINGS

Figure 1:
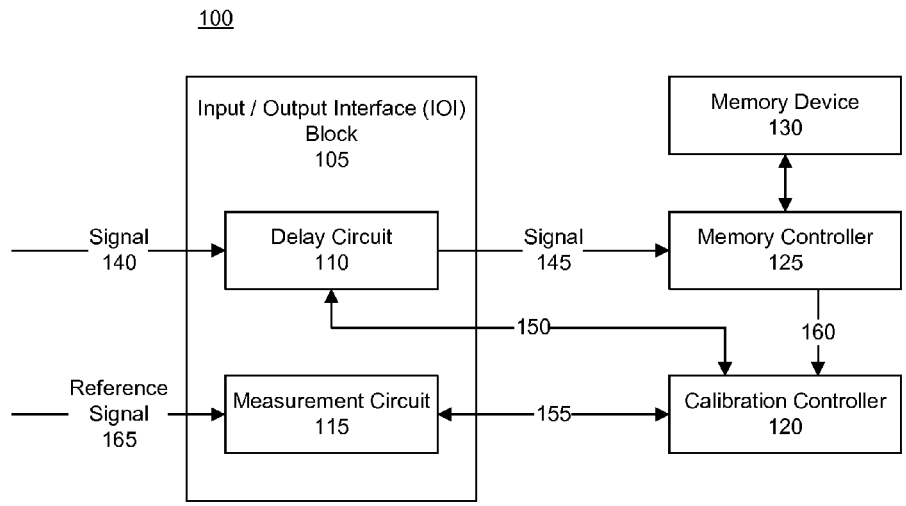
FIG. 1 is a first block diagram illustrating a system for dynamic signal calibration in accordance with one embodiment of the present invention.

While the specification concludes with claims defining the features of one or more embodiments of the invention that are regarded as novel, it is believed that one or more embodiments of the invention will be better understood from a consideration of the description in conjunction with the drawings. As required, one or more detailed embodiments of the present invention are disclosed herein; however, it is to be understood that the disclosed embodiments are merely exemplary of the inventive arrangements, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the one or more embodiments of the invention.

One or more embodiments disclosed within this specification relate to integrated circuit devices (ICs) and, more particularly, to calibrating signals for a memory controller disposed within an IC. In accordance with the inventive arrangements disclosed within this specification, signal calibration for the memory controller can be performed dynamically. The dynamic signal calibration process aligns the clock signal used by the memory controller with respect to data signals exchanged between the memory controller and the memory device coupled to the memory controller. The process is dynamic in the sense that alignment of clock and data signals can be performed without having to stop or interrupt the natural operation of the memory controller. By dynamically calibrating signals, misalignments between clock and data signals that manifest themselves as a consequence of temperature and voltage variations within the IC can be addressed.

One or more embodiments disclosed within this specification can be implemented within an IC. In one aspect, the IC can be one that is not programmable. In another aspect, the IC can be one that is programmable. Programmable ICs are a well-known type of IC that can be programmed to perform specified logic functions. One type of programmable IC, the field programmable gate array (FPGA), typically includes an array of programmable tiles. These programmable tiles can include, for example, input/output blocks (IOBs) and/or input/output interface (IOI) blocks, configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect and programmable logic circuits are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

FIG. 1 is a first block diagram illustrating a system 100 for dynamic signal calibration in accordance with one embodiment of the present invention. System 100 can be implemented within an IC, whether programmable or not. As shown, system 100 can include an IOI block 105, a calibration controller 120, and a memory controller 125. Memory controller 125 can interface with a memory device 130. In one aspect, memory device 130 can be independent of the IC. Memory device 130 can be external to the IC within which system 100 is disposed, e.g., "off-chip." In another aspect, memory device 130 can be disposed within the same IC as system 100.

IOI block 105 can include a delay circuit 110 and a measurement circuit 115. In general, IOI block 105 can receive a signal such as signal 140. IOI block 105 can delay signal 140, via delay circuit 110, and output a time delayed version of signal 140. Thus, as shown, IOI block 105 receives signal 140 and outputs a time delayed version of signal 140 referred to as signal 145. In one embodiment, signal 140 can be a clock signal. In that case, and in another embodiment, signal 140 can be provided to measurement circuit 115 as a reference signal (not shown). In yet another embodiment, signal 140 can be a data signal. In that case, another reference signal 165, e.g., a clock signal, can be provided to measurement circuit 115 as an input.

In one embodiment, signal 140 can be a signal that is received from memory device 130. For example, IOI block 105 can be part of an interface of IC 100 that couples to memory device 130 through which a clock and/or a data signal can be received from memory device 130.

Within this specification, the same reference characters are used to refer to terminals, signal lines, wires, and their corresponding signals. In this regard, the terms "signal," "wire," "connection," "terminal," and "pin" may be used interchangeably, from time-to-time, within the this specification. It also should be appreciated that the terms "signal," "wire," or the like can represent one or more signals, e.g., the conveyance of a single bit through a single wire or the conveyance of multiple parallel bits through multiple parallel wires. Further, each wire or signal can represent bi-directional communication between two, or more, components connected by a signal or wire as the case may be.

Delay circuit 110 can be configured to provide a variable amount of delay to signal 140. In one embodiment, delay circuit 110 can be implemented as a multi-tap delay line. Signal 140 can be delayed according to a tap setting that specifies the number of taps of the multi-tap delay line that are "applied" to signal 140. The tap setting of delay circuit 110 can be changed or varied over time dynamically, thereby changing the amount of delay applied to signal 140. Each tap can provide a predetermined amount of delay.

With variations in temperature and voltage within the IC, however, the predetermined amount of delay provided per tap can vary. The amount of delay provided by a single tap, for example, can vary from as little as approximately 50 picoseconds up to approximately 200 picoseconds depending upon voltage and temperature conditions within the IC. One can see that the amount of delay applied to signal 140, particularly when more than one tap is applied, can vary significantly with voltage and temperature conditions. In consequence, it becomes necessary to adjust the tap setting of delay circuit 110 over time to ensure that the amount of delay applied to the signal 140 remains relatively constant as the amount of delay provided per tap varies.

One example of a delay circuit that can be used within one or more embodiments disclosed within this specification is the IDelay primitive available within various programmable ICs available from Xilinx, Inc. of San Jose, Calif. In some implementations, the IDelay primitive can provide up to 256 taps. Thus, the delay provided by an IDelay primitive can be specified in terms of a number of taps ranging from 1 to 256. Each increase of one in the tap setting increases the delay provided by the IDelay primitive by a predetermined amount of time. As noted, however, the amount of delay provided per tap can vary over time with changes in temperature and voltage within the IC, particularly in and around the vicinity of the IDelay primitive itself.

Measurement circuit 115 can be configured to determine the number of taps of delay circuit 110 that approximate a selected, e.g., predetermined, amount of time referred to herein as a "time span." Typically, the time span is a portion, or fraction, of the period of reference signal 165. For the remainder of this specification, reference signal 165 will be used for purposes of illustration. As noted, however, reference signal 165 can be a clock signal, e.g., a global clock signal, when signal 140 is a data signal or can be the same as signal 140 when signal 140 is a clock signal. In any case, for purposes of illustration, one half of the period of reference signal 165 can be the time span, though the embodiments are not intended to be limited by the particular amount of time used as the time span. Continuing with the example, measurement circuit 115 can determine the number of taps of delay circuit 110 required to approximate the time span.

In one embodiment, for example, measurement circuit 115 can include a ring oscillator and a counter. The ring oscillator can be configured to operate at a frequency that has a predetermined or known relationship to the delay of one tap of delay circuit 110. Thus, a particular number of oscillations of the ring oscillator approximates the delay of one tap of the delay circuit. The counter can count the number of oscillations occurring over the time span as measured directly against reference signal 165. Since the frequency of reference signal 165 is known, as is the relationship of the frequency of the ring oscillator to a tap, measurement circuit 115 can output a value that specifies the number of taps of delay circuit 110 needed to approximate the time span. The number of taps that is output from measurement circuit 115 is referred to as the "maximum value" in reference to the maximum amount of delay that can be applied to signal 140.

Because the ring oscillator is influenced by voltage and temperature variations in much the same way as delay circuit 110, and the taps disposed therein, measurement circuit 115 can provide an accurate estimate of the number of taps needed to approximate the time span. For example, as the amount of delay provided by a tap changes with variations in temperature and/or voltage, the frequency of oscillation of the ring oscillator changes in a proportional manner. Thus, the maximum value output from measurement circuit 115 changes over time, as does the amount of delay provided by a tap, according to varying temperature and/or voltage within the IC comprising system 100.

It should be appreciated that the example configuration provided for measurement circuit 115 is not intended to be a limitation of the embodiments disclosed within this specification. Any of a variety of different measurement circuits can be used that are capable of outputting a value that is indicative of the number of taps of delay circuit 110 necessary to approximate the time span.

Calibration controller 120 is coupled to delay circuit 110 through signal 150 and is coupled to measurement circuit 115 through signal 155. In general, calibration controller 120 can include circuitry that calculates a new tap setting and circuitry, e.g., an output port, that provides the new tap setting to delay circuit 110 via signal 150. The new tap setting effectively adjusts the delay provided by delay circuit 110 to signal 140 to account for variations in voltage and/or temperature that cause the amount of delay provided by a single tap to vary over time.

The calculation performed by calibration controller 120 can depend upon several values such as the current, or old, tap setting as determined, or read from, delay circuit 110 via signal 150 and the maximum value determined by measurement circuit 115 provided via signal 155. Given these values, calibration controller 120 can determine a new tap setting to be loaded or stored within delay circuit 110.

As shown, calibration controller 120 is also coupled to memory controller 125 via refresh signal 160. Memory controller 125 is a circuit that manages the flow of data going into and coming out from memory device 130. Memory controller 125 generates the signals necessary to write data to memory device 130, read data from memory device 130, and refresh memory device 130.

For example, when memory device 130 is implemented as a dynamic random access memory (DRAM), memory controller 125 can be configured to generate signals to store data within the DRAM, read data from the DRAM, and refresh the DRAM as governed by the relevant controlling specification. Similarly, when memory device 130 is implemented as a Double Data Rate (DDR) Synchronous DRAM (SDRAM), then memory controller 125 can be configured to generate the signals necessary to effectuate writes to memory device 130, reads from memory device 130, refresh operations of memory device 130, and the like. The particular type of memory device 130 and memory controller 125 is not intended to limit the embodiments disclosed within this specification. Memory controller 125, however, will be matched, in terms of functionality, to the particular type of memory device 130 that is used.

Memory controller 125, via refresh signal 160, notifies calibration controller 120 when memory controller 125 has started a refresh operation and is within or performing a refresh operation of memory device 130. In one embodiment, calibration controller 120 can perform the calculations necessary to determine the new tap setting during the time in which memory controller 125 is refreshing memory device 130. By performing the calculations and also updating the tap setting of delay circuit 110, i.e., loading the new tap setting into delay circuit 110, during the time in which memory controller 125 is refreshing memory device 130, normal operation of memory controller 125 need not be interrupted. Normal operation of memory controller 125 can continue while ensuring that signal 145 maintains the original offset, e.g., delay, determined during calibration at system startup to preserve alignment of signals exchanged between memory controller 125 and memory device 130. By dynamically adjusting the delay added to signal 140, IOI block 105 ensures that signal 145 is aligned. For example, when signal 140 is a clock signal, dynamic adjustment of the delay added, as described, ensures that signal 145 is positioned within the center of the valid window of the data signals processed by memory controller 125, thereby increasing the likelihood of accurately capturing data.

Though not shown, it should be appreciated that each of a plurality of signals can be processed using the circuitry illustrated with respect to FIG. 1. In this regard, each of a plurality of signals from memory device 130, for example, can be dynamically calibrated as described with reference to FIG. 1 to maintain calibration after an initial calibration procedure is performed.

Figure 2:
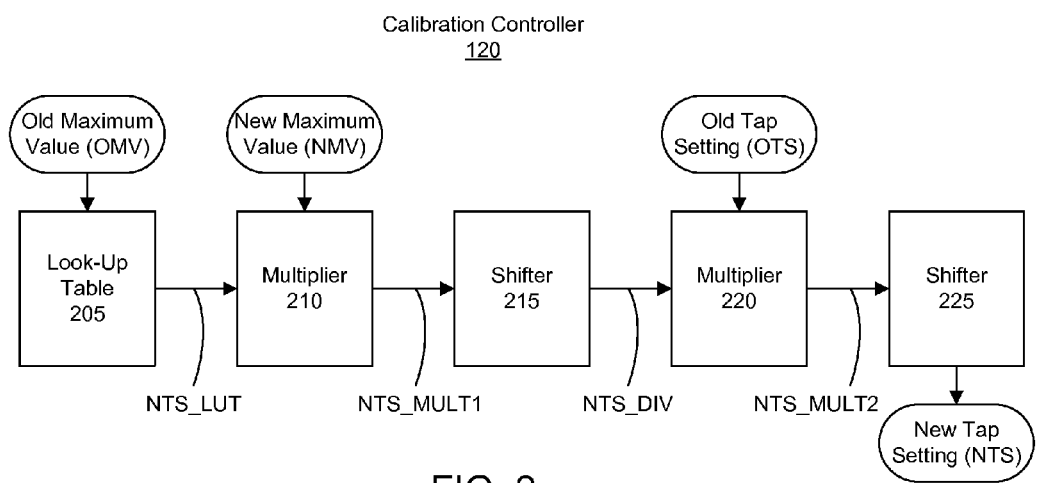
FIG. 2 is a second block diagram illustrating the calibration controller of FIG. 1 in accordance with another embodiment of the present invention.

FIG. 2 is a second block diagram illustrating calibration controller 120 of FIG. 1 in accordance with another embodiment of the present invention. In general, calibration controller 120 can calculate the new tap setting, denoted as NTS, according to the expression NTS=NMV/OMV*OTS. Within the expression for calculating NTS, NMV represents the "new maximum value" that is read from the delay measurement circuit, OMV represents the old maximum value that is the maximum value from a prior calculation of NTS, and OTS represents the old tap setting which is a prior result of the NTS calculation and current tap setting of the delay circuit that is being updated.

Calibration controller 120 calculates a result for the NTS expression. The result is output and provided to the delay circuit as a new or updated tap setting. By calculating the new tap setting as a function of the old tap setting, the expression for NTS presumes that the new tap setting tracks the old tap setting as voltage and/or temperature vary within the IC. Using this approach, where the old tap setting is used in determining the new tap setting, can require significantly less time to calculate or determine as compared to implementing a calibration process anew where operation of the memory controller is paused.

In one embodiment, calibration controller 120 can be implemented as a hard circuit, e.g., a preconfigured circuit on the IC. In such an embodiment, the hardened calibration controller, when implemented within a programmable IC, does not utilize any of the programmable fabric or portion of the IC that is available for implementing user circuit designs. In another embodiment, one or more portions of calibration controller 120 can be implemented using primitives available in the programmable fabric of the IC when the IC is programmable. For example, various multiplication operations to be described with reference to FIG. 2 can be performed using DSP blocks or other multiplication primitives available within the programmable IC. Also, the look-up table can be implemented using a look-up table available within the programmable fabric of the programmable IC as opposed to being implemented as a dedicated look-up table within calibration controller 120.

As pictured in FIG. 2, calibration controller 120 can include a plurality of circuits including look-up table 205, multipliers 210 and 220, and shifters 215 and 225. Calibration controller 120 further can include an output (not shown) that stores NTS within the delay circuit to update the delay provided to the clock signal. Inputs provided to calibration controller 120 can include NMV, OMV, and OTS. As noted, NMV is the most recent maximum value read from the measurement circuit. OMV refers to the prior used "new" maximum value, which can be stored within calibration controller from a prior iteration or calculation. When first calculating NTS, however, OMV can be read from the measurement circuit prior to reading NMV. Similarly, OTS can be the tap setting calculated by calibration controller 120 as NTS for the delay circuit from a prior iteration or calculation. When first calculating NTS, however, OTS can be obtained from the delay circuit.

To facilitate implementation of the NTS expression while utilizing relatively little area of the IC, the NTS expression can be subdivided into a series of operations and corresponding circuit blocks. In one embodiment, the various circuit blocks of calibration controller 120 implement the inclusion of a multiplication factor of one that is introduced into the expression to facilitate more efficient binary computation of the NTS expression. The factor can be introduced in the form of a fraction with a numerator that is equal to the dominator. The numerator and denominator, for example, each can be set equal to $2^N$, where "N" is an integer value. In one embodiment, N can be an even number. In another embodiment, N can be set equal to 16. Using a larger value in the numerator and denominator provides increased granularity and accuracy in the binary computation performed by calibration controller 120.

Observing mathematical order of operations, the numerator and denominator of the factor can be introduced at varying points within the signal flow within calibration controller 120. For example, the numerator of the factor can be added in one processing stage or circuit block. The denominator can be added at another processing stage or circuit block. In one embodiment, the denominator can be added in phases as will be demonstrated with reference to FIG. 2 and the series of equations below. As illustrated, the expression for NTS is multiplied by $2^N/2^N$. Rather than dividing by $2^N$, however, the $2^N$ term of the denominator can be introduced in two separate stages by first dividing by $2^{N/2}$ and then dividing by $2^{N/2}$ again. Rewriting the expression for NTS results in the following:

$$NTS = NMV / OMV \cdot OTS$$
$$= (NMV / OMV * OTS) * 2^N / 2^N$$
$$= 2^N \div OMV * NMV \div 2^{N/2} * OTS \div 2^{N/2}$$

Within digital electronic circuits, dividing by $2^N$ can be performed by simply shifting the dividend N places to the right. By reordering the expression for NTS as illustrated above and using larger values of N, greater granularity can be achieved when calculating NTS. Further, the reordered expression for NTS lends itself to more efficient binary computation in digital circuitry. By breaking the division into two separate operations, each dividing by N/2, binary truncations errors in the division portions of the calculation of NTS can be reduced.

Turning again to FIG. 2, look-up table 205 can store a value for the sub-expression $2^N \div OMV$ for all possible values of OMV. Consider the case where OMV has 256 possible values. In that case, only 256 entries are needed within look-up table 205, which is more efficient to implement than division circuitry when considering area on an IC. It should be appreciated that any rounding of the answer to the sub-expression $2^N \div OMV$ that is stored within look-up table 205 can be determined through experimentation to increase accuracy in adjusting the tap setting. Rounding errors, however, are reduced by selecting larger values of N. The vector size is subsequently reduced in stages within calibration controller 120 to reduce the circuit size while also preserving accuracy in the calculation.

The size of the circuitry needed to store all possible results for the sub-expression $2^N \div OMV$ for all possible values of OMV is smaller than the circuitry needed to actually perform the division operation for the expression $2^N \div OMV$. Accordingly, look-up table 205 receives OMV as an input. Given the value of OMV, look-up table 205 outputs a first result of $2^N \div OMV$ denoted as NTS_LUT. Look-up table 204 provides the first result NTS_LUT to multiplier 210 as an input.

Multiplier 210 also receives NMV as an input and multiplies NTS_LUT with NMV to generate a second result. The second result determined by multiplier 210 can be referred to as NTS_MULT1. Multiplier 210 provides NTS_MULT1 to shifter 215 as an input. Shifter 215 shifts NTS_MULT1 by N/2 places (bits) to the right, effectively dividing NTS_MULT1 by $2^{N/2}$ to generate a third result denoted as NTS_DIV. Shifter 215 provides NTS_DIV to multiplier 220 as an input.

Multiplier 220 also receives OTS as an input and multiplies NTS_DIV by OTS to generate a fourth result referred to as NTS_MULT2. Multiplier 220 outputs NTS_MULT2 and provides NTS_MULT2 to shifter 225 as an input. Shifter 225 shifts NTS_MULT2 by N/2 places (bits) to the right, effectively dividing NTS_MULT2 by $2^{N/2}$. The result that is output from shifter 225 is NTS.

Once obtained, NTS can be provided from calibration controller 120, e.g., via the output port, to the delay circuit and stored therein. Within calibration controller 120, NTS can be stored as OTS for use in the next iteration of the calculation. By storing NTS as OTS, OTS need not be obtained from the delay circuit for each calculation of NTS. Similarly, NMV can be stored within calibration controller 120 as OMV for use during the next calculation of NTS.

The embodiment illustrated in FIG. 2 depicts two distinct multipliers and two distinct shifters. It should be appreciated that in another embodiment, a single multiplier can be used, a single shifter can be used, or both a single shifter and a single multiplier can be used. Though two independent multiplication operations and/or two independent shifting operations still are performed, multiplexing circuitry can be used or included thereby allowing a single multiplier to perform both multiplication operations and/or a single shifter to perform both shifting/division operations.

Figure 3:
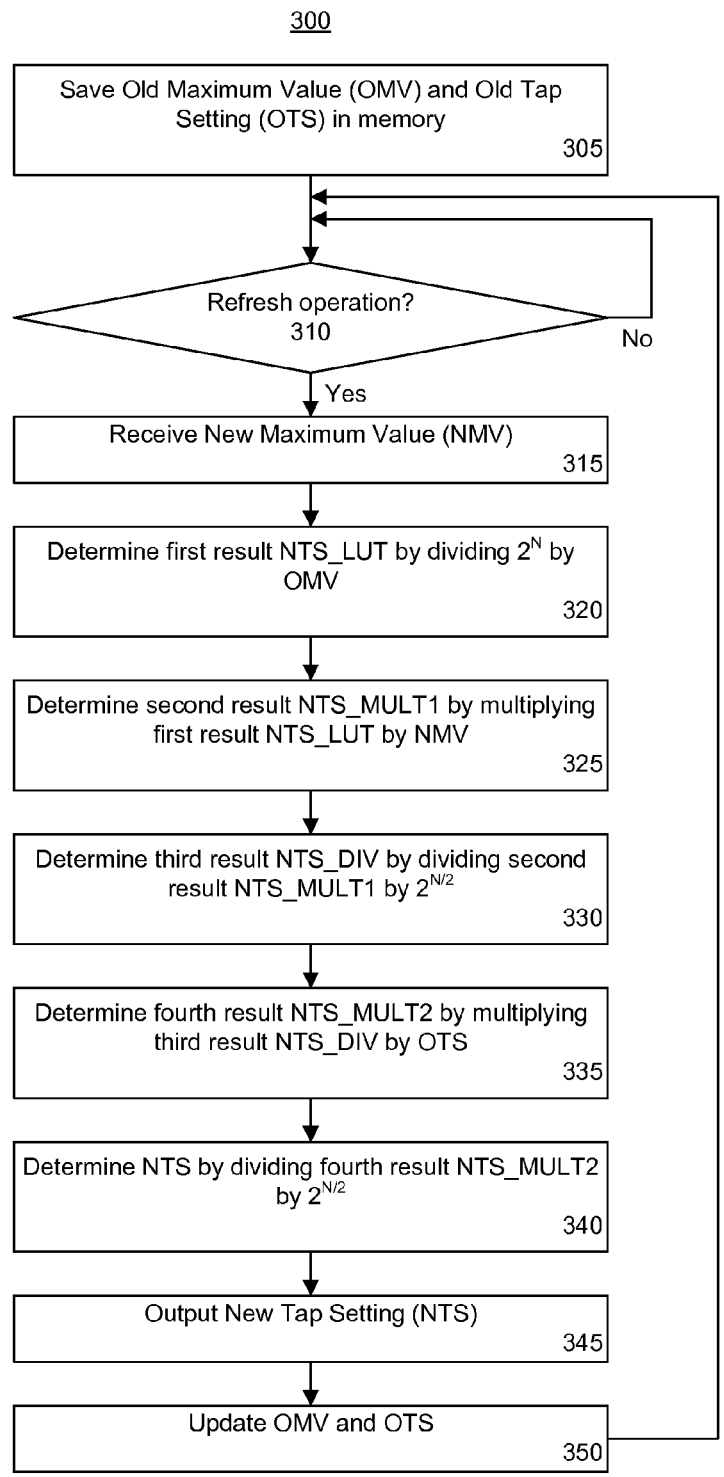
FIG. 3 is a flow chart illustrating a method of dynamic signal calibration in accordance with another embodiment of the present invention.

FIG. 3 is a flow chart illustrating a method 300 of dynamic signal calibration in accordance with another embodiment of the present invention. Method 300 can be performed by a calibration controller as described with reference to FIGS. 1 and 2. Accordingly, method 300 can begin in a state in which signals, e.g., signals exchanged between the memory controller and the memory device, have already been aligned, or calibrated, through a calibration process. Such a calibration process can be performed upon startup of the IC within which the memory controller is disposed, for example.

In step 305, the calibration controller can save OMV and OTS in memory. For example, the first time that the calibration controller performs the calculation to determine NTS, OMV can be read directly from the measurement circuit. OTS can be read directly from the delay circuit. For each subsequent calculation of NTS, NTS can be saved as OTS and NMV can be stored as OMV.

In step 310, the calibration controller can determine whether a refresh operation has begun. As discussed, the calibration controller can receive a signal from the memory controller that indicates when the memory controller has started and is conducting a refresh operation to refresh the memory device coupled to the memory controller. When no refresh operation is detected, method 300 can continue to loop through step 310. When a refresh operation is detected, method 300 can proceed to step 315. Thus, only when a refresh operation is detected does the calibration controller continue to calculate NTS for the delay circuit and store NTS within the delay circuit, thereby updating the delay applied to the signal.

In step 315, the calibration controller can receive NMV. As noted, NMV can be received, or obtained, from the measurement circuit. In step 320, the calibration controller can determine a first result by dividing $2^N$ by OMV. As noted, the determination of the first result called NTS_LUT can be performed using a look-up table.

In step 325, the calibration controller can determine a second result NTS_MULT1 by multiplying the first result NTS_LUT by NMV. In step 330, the calibration controller can determine the third result NTS_DIV by dividing the second result NTS_MULT1 by $2^{N/2}$. As noted, dividing by $2^{N/2}$ can be performed by shifting NTS_MULT1 to the right by N/2 bits. In step 335, the calibration controller can determine the fourth result NTS_MULT2 by multiplying the third result NTS_DIV by OTS. In step 340, the calibration controller can determine NTS by dividing the fourth result NTS_MULT2 by $2^{N/2}$.

In step 345, NTS can be output. For example, NTS can be output to the delay circuit and stored therein as a new setting. Responsive to NTS being stored within the delay circuit, the delay circuit begins applying an amount of delay specified by NTS to the signal.

In step 350, OMV and OTS are updated. More particularly, the calibration controller stores NTS as OTS. The calibration controller further stores NMV as OMV. After step 350, the method can repeat as necessary.

It should be appreciated that the entire process relating to calculating a new tap setting, e.g., steps 315-345 and optionally step 350, can be performed entirely within, or during, the refresh operation. Thus, prior to the memory controller and memory coupled to the memory controller resuming normal operation after a refresh operation, the delay in the delay circuit can be updated or modified according to NTS.

The flowchart in the figures illustrates the architecture, functionality, and operation of possible implementations of systems, methods and computer program products according to one or more embodiments of the present invention. In this regard, each block in the flowchart may represent a module, segment, or portion of code, which comprises one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustration, and combinations of blocks in the flowchart illustration, can be implemented by special purpose hardware-based systems that perform the specified functions or acts, or combinations of special purpose hardware and executable instructions.

One or more embodiments of the present invention can be realized in hardware or a combination of hardware and software. One or more embodiments of the present invention further can be embedded in a device such as a computer program product, which comprises all the features enabling the implementation of the methods described herein. The device can include a data storage medium, e.g., a computer-usable or computer-readable medium, storing program code that, when loaded and executed in a system comprising memory and a processor, causes the system to perform the functions described herein and/or to instantiate a circuit or system as described herein within an IC. Examples of data storage media can include, but are not limited to, optical media, magnetic media, magneto-optical media, computer memory such as random access memory or hard disk(s), or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed herein can be embodied in other forms without departing from the spirit or essential attributes thereof. Accordingly, reference should be made to the following claims, rather than to the foregoing specification, as indicating the scope of one or more embodiments of the present invention.

What is claimed is:

1. Within an integrated circuit comprising a memory controller, a method comprising:
responsive to determining that the memory controller is performing a refresh operation, calculating a new tap setting according to a new maximum value and an old tap setting specifying a delay applied to a signal by a delay circuit, wherein the new maximum value specifies a number of taps of the delay circuit that approximates a predetermined time span; and
dynamically adjusting the delay applied to the signal by the delay circuit according to the new tap setting, wherein the delay circuit generates a delayed signal that is provided to the memory controller.

2. The method of claim 1, wherein calculating a new tap setting further comprises:
determining the new tap setting according to a ratio of the new maximum value to an old maximum value.

3. The method of claim 1, wherein calculating a new tap setting further comprises:
determining the new tap setting according to a product of a ratio of the new maximum value to an old maximum value and the old tap setting.

4. The method of claim 3, wherein calculating a new tap setting is performed using binary values, wherein determining the new tap setting further comprises:
first, determining a first result for $2^N$ divided by the old maximum value, wherein N is an even integer;
second, determining a second result by multiplying the first result by the new maximum value;
third, determining a third result by dividing the second result by $2^{N/2}$;
fourth, determining a fourth result by multiplying the third result by the old tap setting; and
fifth, determining the new tap setting by dividing the fourth result by $2^{N/2}$.

5. The method of claim 4, wherein determining a first result for $2^N$ divided by the old maximum value further comprises:
determining the first result from a look-up table comprising results for $2^N$ over a specified range of values for the old maximum value.

6. The method of claim 5, further comprising:
determining the third result by shifting the second result N/2 bits to the right; and
determining the new tap setting by shifting the fourth result N/2 bits to the right.

7. The method of claim 1, further comprising completing the calculating of the new tap setting prior to completion of the refresh operation.

8. The method of claim 1, further comprising completing the dynamically adjusting of the delay according to the new tap setting prior to completion of the refresh operation.

9. A system disposed within an integrated circuit, the system comprising:
a delay circuit configured to apply a delay to a signal generating a delayed signal provided to a memory controller;
a measurement circuit configured to calculate a new maximum value specifying a number of taps of the delay circuit that approximates a predetermined time span; and
a calibration controller coupled to the delay circuit and the measurement circuit, wherein the calibration controller is configured to calculate a new tap setting for the delay circuit according to the new maximum value and an old tap setting of the delay circuit responsive to determining that a memory controller is performing a refresh operation,
wherein the calibration controller dynamically adjusts the delay applied to the signal by the delay circuit according to the new tap setting.

10. The system of claim 9, wherein the calibration controller is further configured to calculate the new tap setting according to a ratio of the new maximum value to an old maximum value.

11. The system of claim 9, wherein the calibration controller is further configured to determine the new tap setting according to a product of a ratio of the new maximum value to an old maximum value and the old tap setting.

12. The system of claim 11, wherein the calibration controller is further configured to calculate a new tap setting using binary values by:
   first, determining a first result for $2^N$ divided by the old maximum value, wherein N is an even integer;
   second, determining a second result by multiplying the first result by the new maximum value;
   third, determining a third result by dividing the second result by $2^{N/2}$;
   fourth, determining a fourth result by multiplying the third result by the old tap setting; and
   fifth, determining the new tap setting by dividing the fourth result by $2^{N/2}$.

13. The system of claim 12, wherein the calibration controller further comprises a look-up table storing a plurality of first results corresponding to possible values of old maximum value from which the first result is determined.

14. The system of claim 13, wherein the calibration controller further comprises:
   at least one shifter determining the third result by shifting the second result N/2 bits to the right and determining the new tap setting by shifting the fourth result N/2 bits to the right.

15. The system of claim 9, wherein the calibration controller is further configured to complete the calculation of the new tap setting prior to completion of the refresh operation.

16. The system of claim 15, wherein the calibration controller is further configured to complete the dynamic adjustment of the delay according to the new tap setting prior to completion of the refresh operation.

17. A calibration controller disposed within an integrated circuit, the calibration controller comprising:
   first circuitry configured to calculate a new tap setting for a delay circuit according to a new maximum value and an old tap setting of the delay circuit responsive to determining that a memory controller is performing a refresh operation, wherein the new maximum value specifies a number of taps of the delay circuit that approximates a predetermined time span; and
   second circuitry coupled to the first circuitry, wherein the second circuitry is configured to dynamically adjust the delay applied to the signal according to the new tap setting by outputting the new tap setting to the delay circuit,
   wherein the first and second circuitry are operational to calculate the new tap setting and adjust the delay prior to completion of the refresh operation.

18. The calibration controller of claim 17, wherein the first circuitry is further configured to determine the new tap setting according to a ratio of the new maximum value to an old maximum value.

19. The calibration controller of claim 17, wherein the first circuitry is further configured to determine the new tap setting according to a product of a ratio of the new maximum value to an old maximum value and the old tap setting.

20. The calibration controller of claim 19, wherein the first circuitry further comprises:
   a look-up table configured to determine a first result for $2^N$ divided by the old maximum value, wherein N is an even integer;
   at least one multiplier configured to determine a second result by multiplying the first result by the new maximum value; and
   at least one shifter configured to determine a third result by shifting the second result by N/2 bits to the right;
   wherein the at least one multiplier is further configured to determine a fourth result by multiplying the third result by the old tap setting; and
   wherein the at least one shifter is further configured to determine the new tap setting by shifting the fourth result by N/2 bits to the right.

\* \* \* \* \*